(12) United States Patent
Kamiya et al.

(10) Patent No.: US 7,195,968 B2
(45) Date of Patent: Mar. 27, 2007

(54) METHOD OF FABRICATING SEMICONDUCTOR DEVICE

(75) Inventors: Eiji Kamiya, Mie (JP); Hirohisa Iizuka, Mie (JP); Hiroaki Hazama, Mie (JP); Kazuhito Narita, Mie (JP); Norio Ohtani, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/126,285

(22) Filed: May 11, 2005

(65) Prior Publication Data
US 2005/0253202 A1 Nov. 17, 2005

(30) Foreign Application Priority Data
May 12, 2004 (JP) ............................. 2004-142306

(51) Int. Cl.
*H01L 21/336* (2006.01)
(52) U.S. Cl. .................. 438/217; 438/194; 438/266
(58) Field of Classification Search ................ 257/316; 438/266, 201, 211, 257, 217, 194
See application file for complete search history.

(56) References Cited

U.S. PATENT DOCUMENTS
2006/0022259 A1* 2/2006 Kobayashi et al. .......... 257/321

FOREIGN PATENT DOCUMENTS
JP 2003-7817 1/2003

* cited by examiner

*Primary Examiner*—Douglas W. Owens
(74) *Attorney, Agent, or Firm*—Oblon, Spivak, McClelland, Maier & Neustadt, P.C.

(57) ABSTRACT

A method of fabricating a semiconductor device includes forming a resist pattern so that an opening between select gates of a select gate transistor is formed in a memory cell region, implanting threshold-adjusting ions under the select gate with the resist pattern serving as a mask and removing an oxide film, forming a nitride film and an interlayer insulation film after the resist pattern has been removed, forming a resist pattern used to form a contact hole between the select gates and a contact hole for a transistor to be formed in the peripheral circuit region, the transistor having a higher breakdown voltage than a memory cell transistor and etching the interlayer insulation film, the nitride film and the gate insulation film individually with the resist pattern serving as a mask.

4 Claims, 11 Drawing Sheets

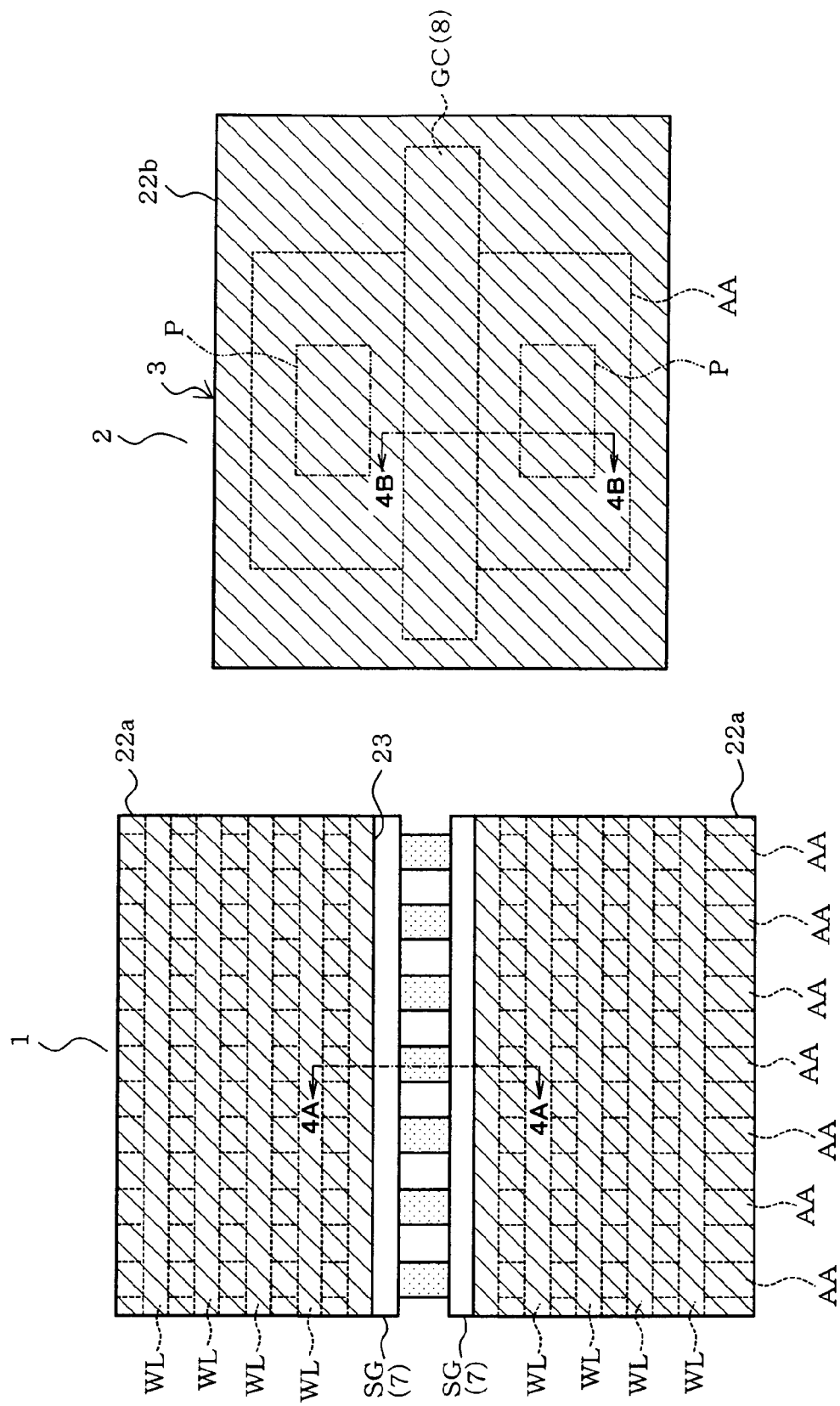

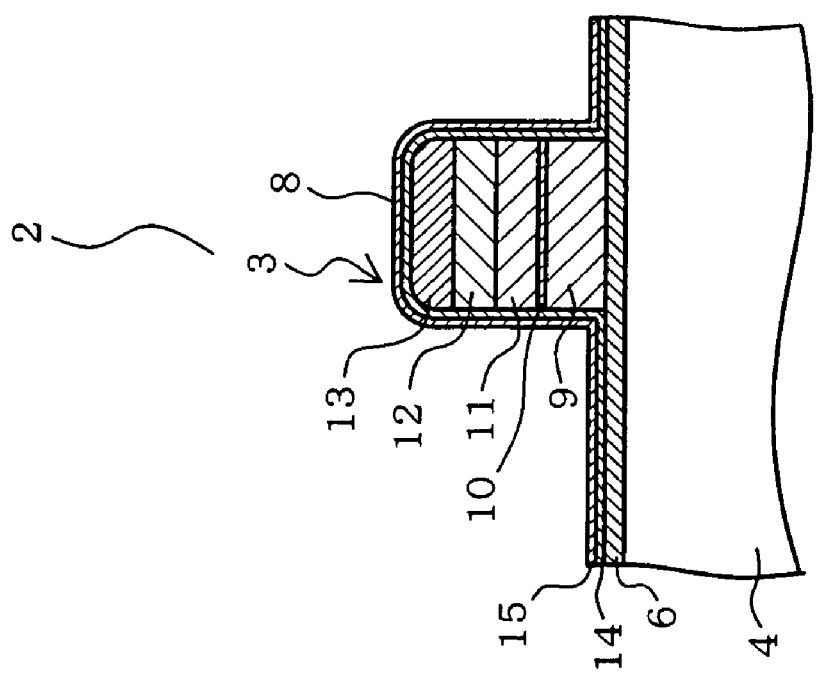
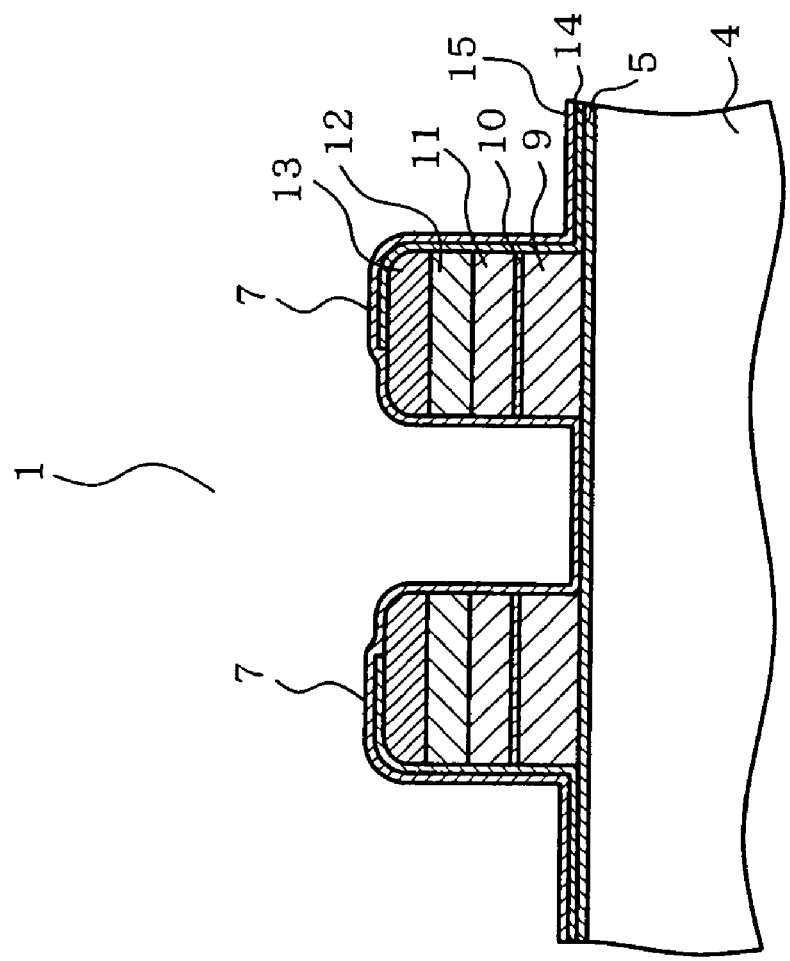
FIG. 6A
FIG. 6B

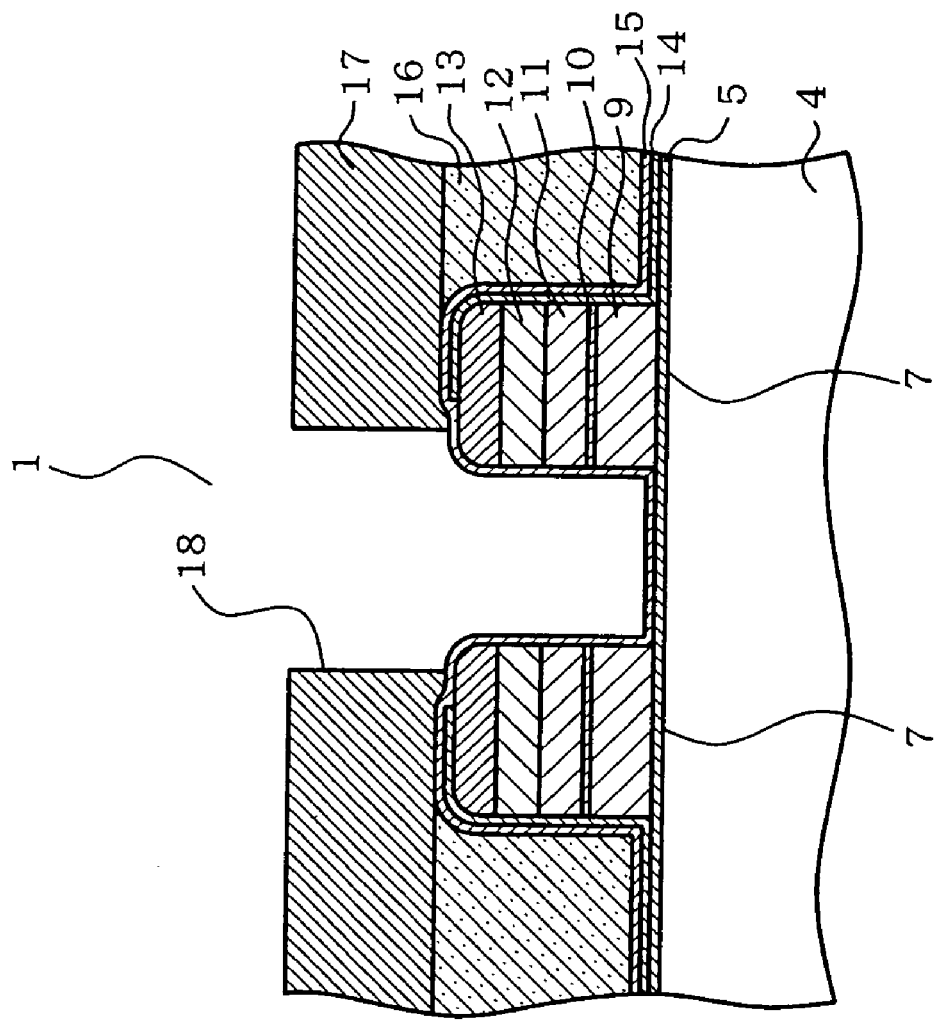
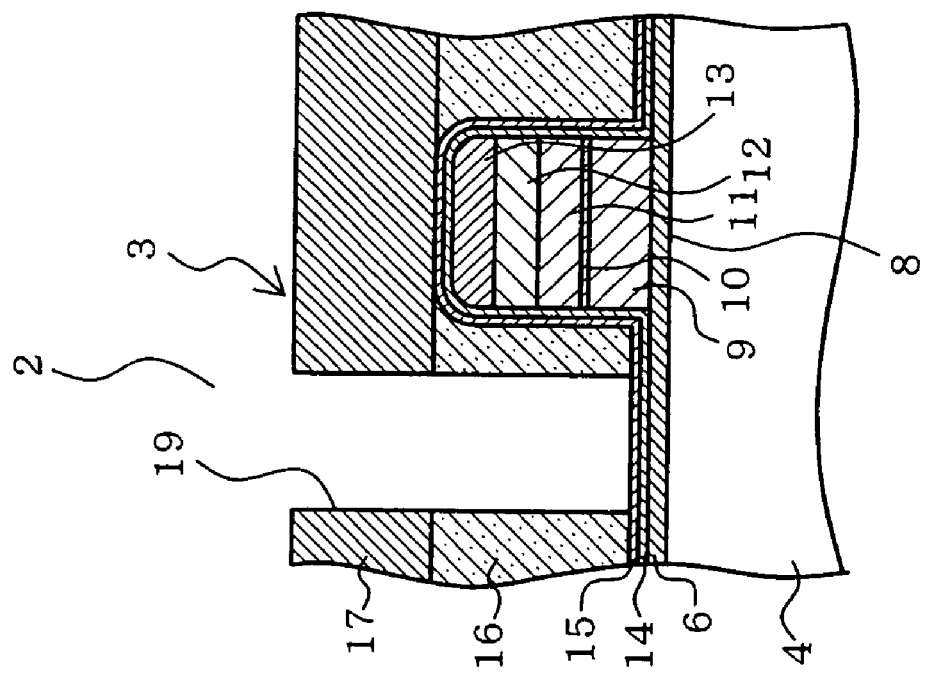
FIG. 9A
FIG. 9B

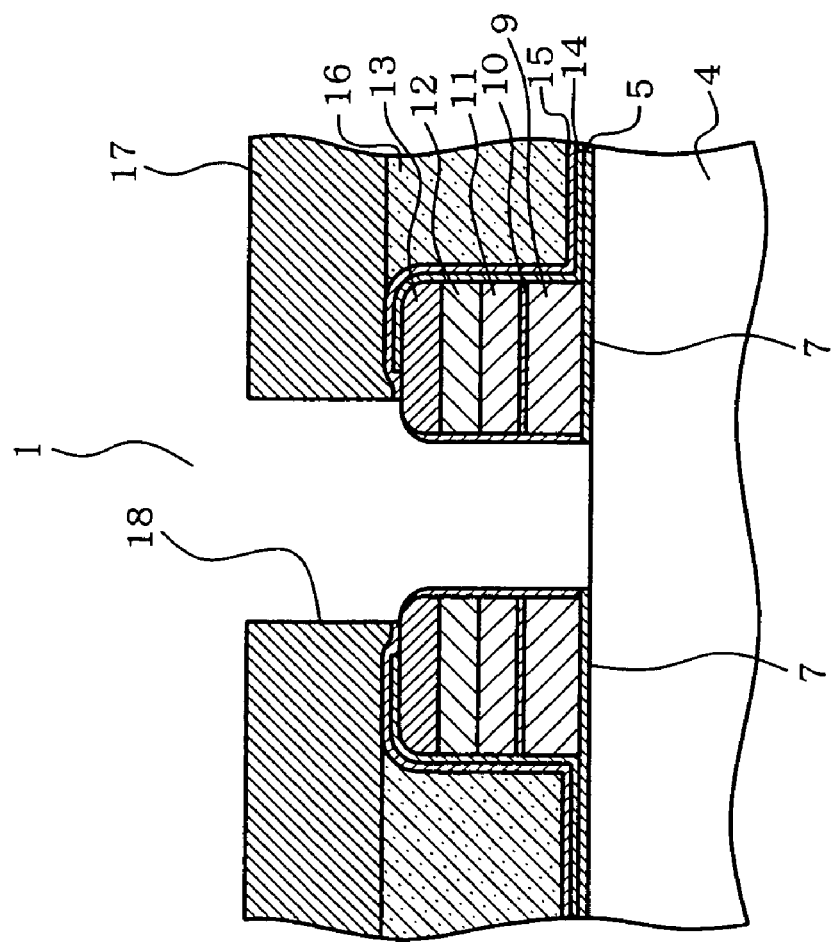
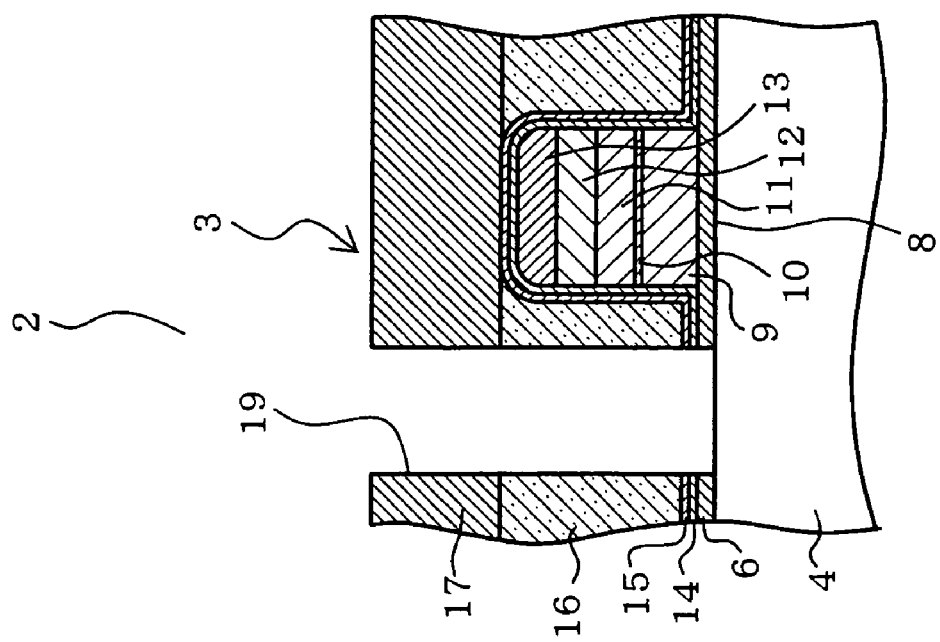

METHOD OF FABRICATING SEMICONDUCTOR DEVICE

CROSS-REFERENCE TO RELATED APPLICATIONS

This application is based on and claims the benefit of priority from the prior Japanese Patent Application No. 2004-142306, filed on May 12, 2004, the entire contents of which are incorporated herein by reference.

BACKGROUND OF THE INVENTION

1. Field of the Invention

The present invention relates to a semiconductor device including a memory cell region, a peripheral circuit region and transistors provided in the respective regions, and a method of fabricating the same.

2. Description of the Related Art

A fabricating process of semiconductor devices generally includes a number of times of a photolithography process. Since multi-functionalization and refinement of semiconductor devices have been progressing year by year, a reduction in the fabricating process for reducing the fabrication cost has merits in connection with both an improvement in the yield and cost reduction.

However, reducing the number of times of the photolithography process means reducing the number of photomasks to be produced. Actually, the number of processes using photomasks cannot be reduced simply in relation with other processes. For example, JP-A-2003-7817 discloses a technique for simultaneously forming a bit line contact hole, a contact hole to a peripheral circuit and a gate contact hole. Etching is performed to form each contact hole simultaneously with the sidewall of a plurality of gate structures as an etching mask under the condition of larger etching selection ratio of oxide to nitride and continuously under the condition of larger etching selection ratio of nitride to oxide and larger etching rate of nitride in a perpendicular direction than that in a lateral direction. Consequently, the aforesaid effect can be achieved since the number of times of the photolithography process is reduced as compared with the process in which the contact holes are formed separately.

However, the foregoing reference is directed to integration of photolithography processes concerning forming contact holes. It is conceivable that another problem will occur when the photolithography process is integrated with another kind of process. Thus, the integration cannot easily be carried out. Accordingly, there is a case where it is difficult to integrate the photolithography processes since processing contents differ from each other in spite of similarity in mask patterns. For example, patterns of photomasks are similar to each other between a process in which a threshold is adjusted by implanting ions into a lower part of the gate electrode in order that a cutoff characteristic of a select gate transistor to be formed in a memory cell region may be improved and another process in which an oxide film formed after gate formation is peeled. However, it is difficult to integrate these processes because of slight difference in the patterns. More specifically, a mask used to form a resist pattern for ion implantation is open only between select gates in the memory cell regions. On the other hand, the mask pattern used to peel the oxide film is designed to be open in a part corresponding to a contact of a peripheral circuit region since the pattern is used to peel an oxide film on a part corresponding to the contact so as to correspond to a process of forming an opening of a contact window.

Accordingly, when the ion implantation is to be carried out with the mask pattern used in the process of peeling the oxide film, impurity is doped into the contact region of the peripheral circuit region. Since a transistor with high breakdown voltage is formed, there is a possibility that necessary breakdown voltage cannot be obtained because of high impurity density.

Furthermore, when the mask pattern for the ion implantation is used in the process of peeling an oxide film, the oxide film cannot be peeled in the transistor of the peripheral circuit. As a result, a malfunction may result from difference between film thicknesses of films.

BRIEF SUMMARY OF THE INVENTION

Therefore, an object of the present invention is to provide a semiconductor device in which a photolithography process for ion implantation to adjust the threshold in the lower part of the gate electrode can be integrated with another photolithography process for peeling the oxide film, and a method of fabricating such a semiconductor device.

The invention provides a method of fabricating a semiconductor device, comprising forming gate insulation films in memory cell and peripheral circuit regions of a semiconductor substrate respectively, the gate insulation films having respective predetermined film thicknesses, forming gate electrodes in the memory cell and peripheral circuit regions respectively, forming an oxide film so that the gate electrodes are covered with the oxide film, forming a resist pattern so that an opening between the select gates of a select gate transistor is formed in the memory cell region, implanting threshold-adjusting ions under the select gate with the resist pattern serving as a mask and removing the oxide film, forming a nitride film and an interlayer insulation film after the resist pattern has been removed, forming a resist pattern used to form a contact hole between the select gates and a contact hole for a high breakdown voltage transistor to be provided in the peripheral circuit region, and etching the interlayer insulation film, the nitride film and the gate insulation film individually with the resist pattern serving as a mask.

BRIEF DESCRIPTION OF THE DRAWINGS

Other objects, features and advantages of the present invention will become clear upon reviewing the following description of one embodiment with reference to the accompanying drawings, in which:

FIGS. 3A and 3B are similar to FIGS. 2A and 2B respectively, showing an ion-implanting resist pattern;

FIGS. 6A and 6B are similar to FIGS. 1A and 1B respectively, showing further another stage of the fabricating process;

FIGS. 9A and 9B are similar to FIGS. 1A and 1B respectively, showing further another stage of the fabricating process;

FIGS. 11A and 11B are similar to FIGS. 1A and 1B respectively, showing further another stage of the fabricating process.

DETAILED DESCRIPTION OF THE INVENTION

Figure 1A:
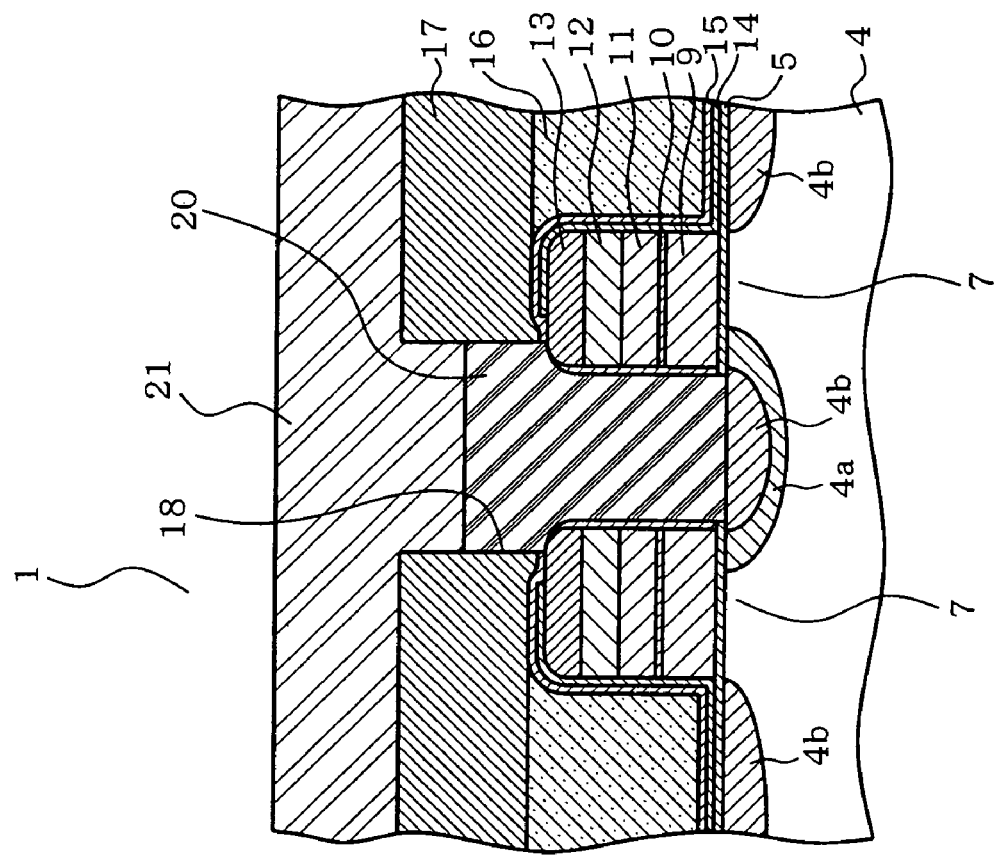
FIGS. 1A and 1B are schematic sectional views of a memory cell region and a high-breakdown voltage transistor of a semiconductor device of one embodiment in accordance with the present invention.
Figure 1B:
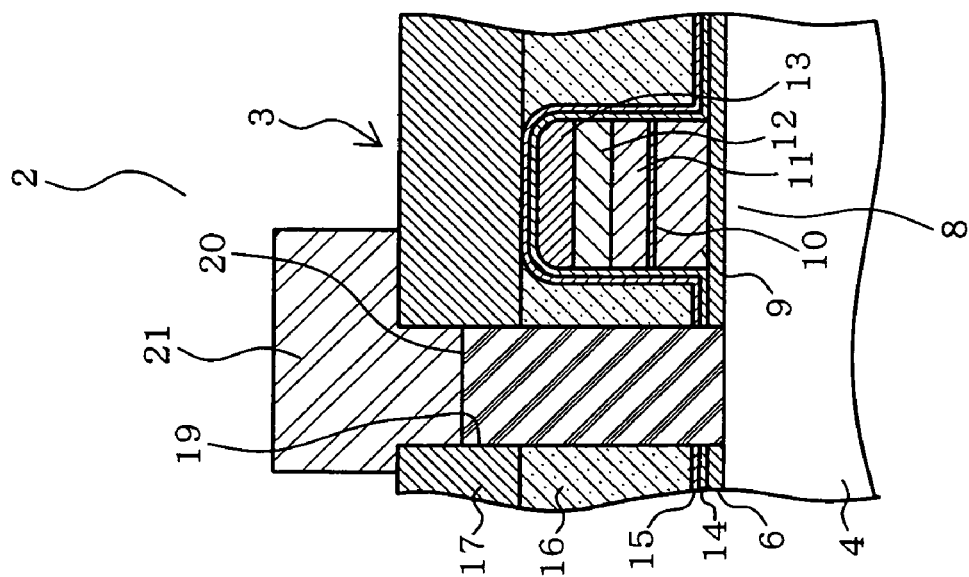

One embodiment of the present invention will be described with reference to the accompanying drawings. The invention is applied to a NAND flash memory in the embodiment. FIGS. 1A and 1B show contact-forming portions of a memory cell region 1 and a peripheral circuit region 2 of the NAND flash memory. FIG. 1A shows a contact hole forming portion between select gates SG adjacent to each other. FIG. 1B shows a contact hole portion of the high breakdown voltage transistor 3.

Figure 2B:
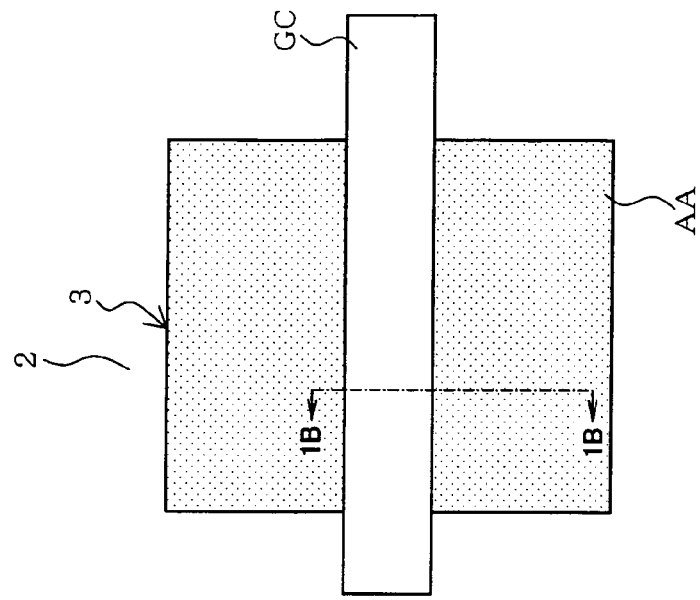
FIGS. 2A and 2B are plan views obtained after gates have been formed, corresponding to FIGS. 1A and 1B respectively.
Figure 2A:
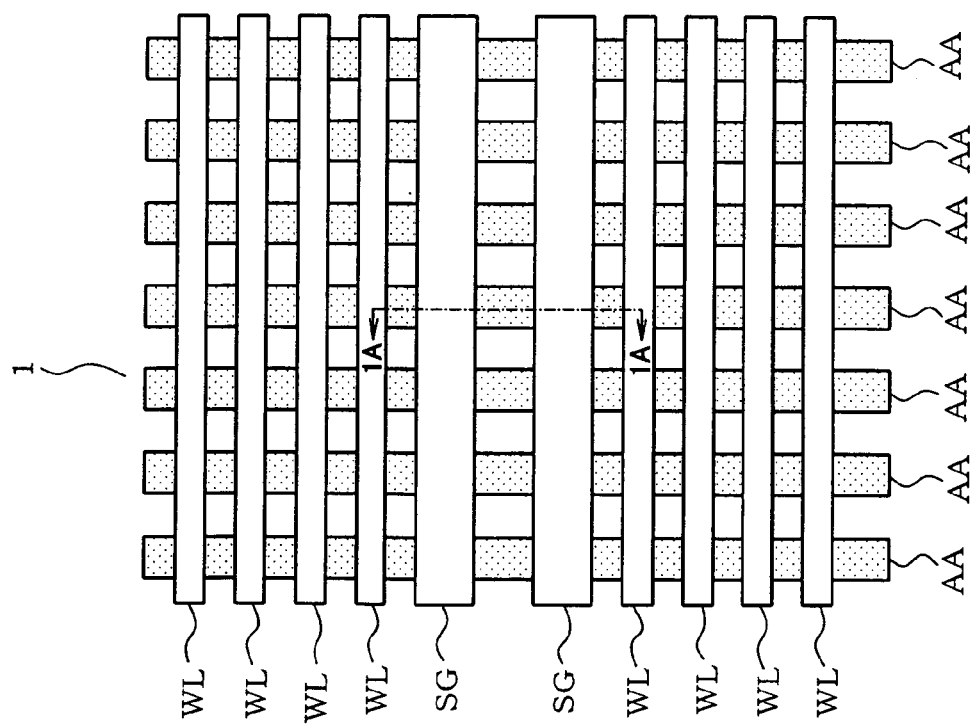

FIGS. 2A and 2B are plan views showing a basic arrangement of the high breakdown voltage transistor 3. FIGS. 1A and 1B are sectional views taken along lines 1A—1A and 1B—1B respectively. FIGS. 2A and 2B show the conditions after gates have been formed. In the memory cell region 1 as shown in FIG. 2A, a plurality of active areas AA are formed so as to extend vertically as viewed in the figure. The active areas AA are separated by shallow trench isolation (STI). A predetermined number of gate electrodes WL and two select gates SG are formed so as to extend laterally as viewed in FIG. 2A. The gate electrodes constitute memory cell transistors, whereas the select gates constitute select gate transistors. FIG. 2B shows the active area of the high breakdown voltage transistor 3 and a gate electrode GC formed in an upper active area AA.

In the arrangement as shown in FIGS. 1A and 1B, a bit line contact is formed between the select gates SG of the memory cell region, and contacts of the high-breakdown-voltage transistor 3 in the peripheral circuit region 2. A wiring layer is formed on the contacts. More specifically, a thin gate oxide film 5 serving as a gate insulation film is formed on the surface of the silicon substrate 4 so as to be located in the memory cell region 1, whereas a thick gate oxide film 6 is formed on the transistor 3 so as to correspond to the high breakdown voltage.

A gate electrode (not shown) of the memory cell transistor is formed on the gate oxide film 5 in the memory cell region 1. A gate electrode 7 of the select gate SG is also formed on the gate oxide film 5. The high breakdown voltage transistor 3 has a gate electrode 8 formed on the gate oxide film 6 in the peripheral circuit region 2. On each of the gate electrodes 7 and 8 are sequentially placed a polycrystalline silicon film 9, an oxide-nitride-oxide (ONO) film 10, a polycrystalline silicon film 11, a tungsten silicide (WSi) film 12 and a silicon nitride film 13.

A thin silicon oxide film is formed by thermal oxidation on the surfaces of the gate electrodes 7 ad 8 so as to cover the surfaces. Another silicon oxide film 14 is formed on the gate oxide film 6 for the ensuring of reliability by the chemical vapor deposition (CVD). The silicon oxide film 14 includes a portion that corresponds to the contact-forming portion between upper parts of the gate electrodes 7 and is removed. A silicon nitride film 15 is formed on the upper parts of the gate electrodes 7.

A borophosphosilicate glass (BPSG) film 16 is formed so as to bury a recess between the gate electrodes 7 and 8. The BPSG film 16 is flattened on the upper surfaces of the electrodes 7 and 8. A silicon oxide film 17 is formed on the BPSG film 16 by the plasma CVD. A contact hole 18 of the self align contact (SAC) type is formed between the gate electrodes 7. A contact hole 19 is also formed at the side of the gate electrode 8 of the high-breakdown-voltage transistor 3.

The silicon oxide films 5, 6 and 14, the silicon nitride film 15 and the like are removed from the inside of each contact hole 18 and 19. A contact plug 20 is buried in the inside of each contact hole 18 and 19. A wiring layer 21 is formed on an upper surface of the contact plug 20 so as to be electrically connected to the contact plug. An ion implantation layer 4a for threshold control is formed on a portion of the substrate 4 between the gate electrodes 7 of the select gate by the ion implantation process as will be described later. Ions serving as impurity such as B, $BF_2$ are implanted so as to reach a lower region of each gate electrode 7, whereby a threshold of the select gate is adjusted. Furthermore, a normal diffusion layer 4b is formed inside a region where the ion implantation layer 4a is to be formed. The diffusion layer 4b is implanted with arsenic (As), phosphor (P) and the like serving as impurities.

In the above-described arrangement, the contact hole 18 corresponding to the bit-line contact in the memory cell region 1 is formed by the self alignment. Accordingly, the silicon oxide film 14 and the silicon nitride film 15 are formed so as to be removed from the surface of the substrate 4 located between the gate electrodes 7. Furthermore, in the peripheral circuit region 2, the substrate 4 includes a part that is a bottom of the contact hole 19 of the high-breakdown voltage transistor 3 and is exposed. The contact plug 20 is formed so as to be electrically connected to the aforesaid part of the substrate 4. Around the bottom of the contact hole 19 are left the gate oxide film 6, silicon oxide film 14 and silicon nitride film 15.

A fabrication process of the foregoing arrangement will be described with reference to FIGS. 3A to 11B. Firstly, the gate oxide films 5 and 6 are formed on the substrate 4. Furthermore, the active area AA is formed by the STI on the substrate 4 during the forming of the gate electrodes 7 and 8. On each of the gate electrodes 7 and 8 are sequentially placed the polycrystalline silicon film 9, ONO film 10, polycrystalline silicon film 11, WSi film 12 and silicon nitride film 13, so that a gate is formed.

FIG. 2A shows a pattern of gate electrodes WL and select gate electrodes SG (7) in the memory cell region 1 in the active area AA. The gate electrodes WL constitute a memory cell transistor, whereas the select gate electrodes SG constitute a select gate transistor. FIG. 2B shows an active area AA of the high breakdown voltage transistor 3 and gate electrodes GC (8) both in the peripheral circuit region 2.

Figure 4B:
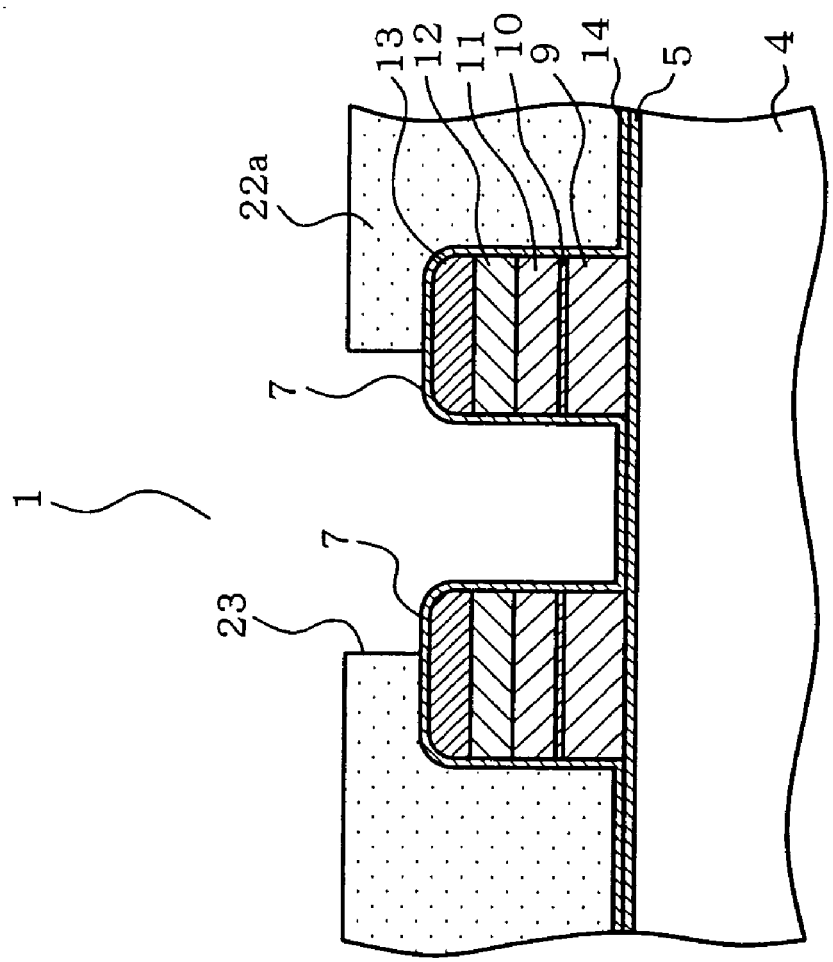
FIGS. 4A and 4B are similar to FIGS. 1A and 1B respectively, showing a stage of the fabricating process.
Figure 4A:
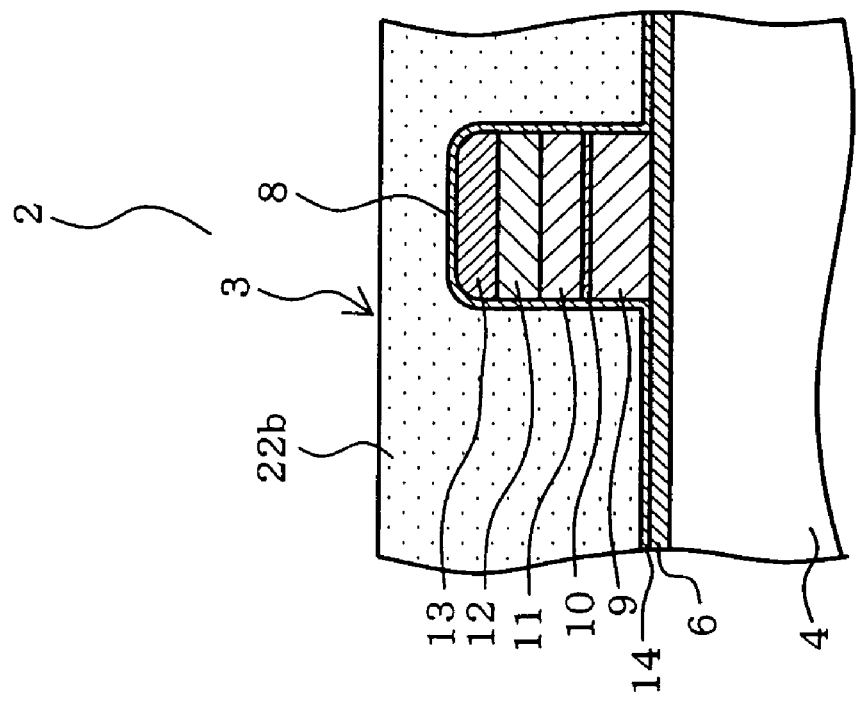

A thin silicon oxide film by thermal oxidation is formed on the surfaces of the gate electrodes 7 and 8 through a post oxidation step. Another silicon oxide film 14 is formed on the surfaces of the gate electrodes 7 and 8 for the ensuring of reliability by the low pressure chemical vapor deposition (LPCVD). Furthermore, following a step of forming a peripheral diffusion layer and the like, ion implantation is carried out for adjustment of a threshold of the select gate transistor as shown in FIGS. 3 and 4, and the photolithography process is carried out for removal of an oxide film. In the photolithography process, resist patterns 22a and 22b are formed on the surface of the substrate 4. The resist pattern 22a is patterned so as to have an opening 23 between the select gates SG. The resist pattern 22b is formed so that an entire surface of the transistor 3 is covered by the resist. The resist pattern 22a is patterned so that the open end thereof is located on the upper surfaces of the select gates 7 as shown in FIG. 4.

Figure 5B:
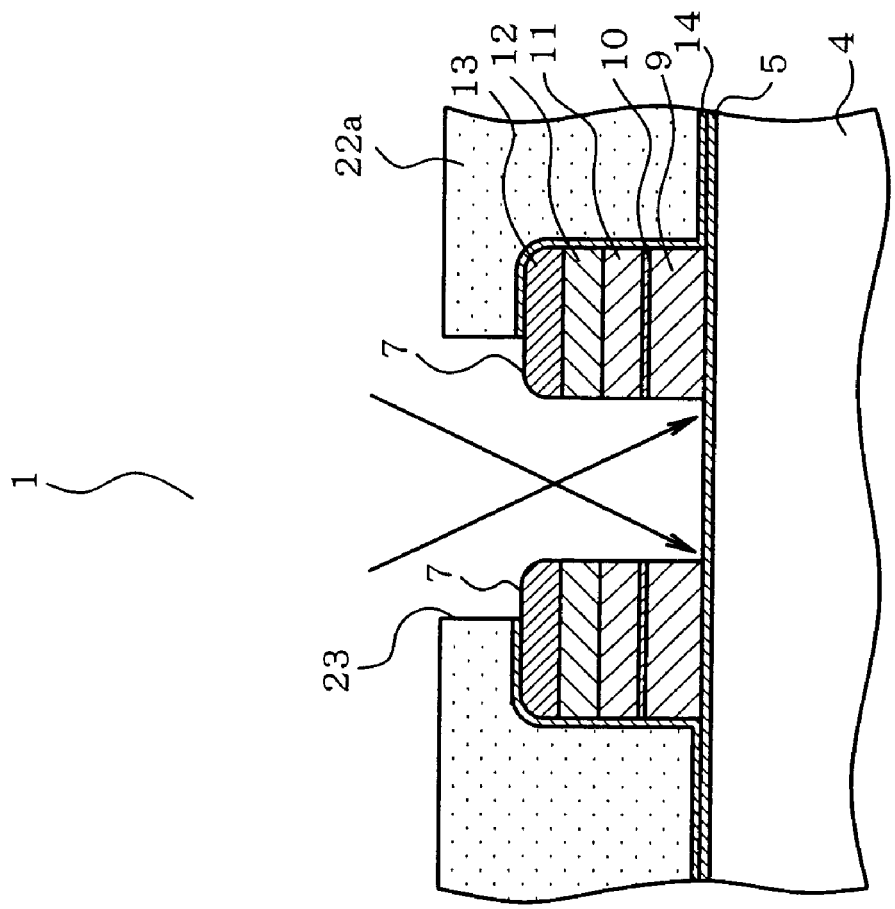
FIGS. 5A and 5B are similar to FIGS. 1A and 1B respectively, showing another stage of the fabricating process.
Figure 5A:
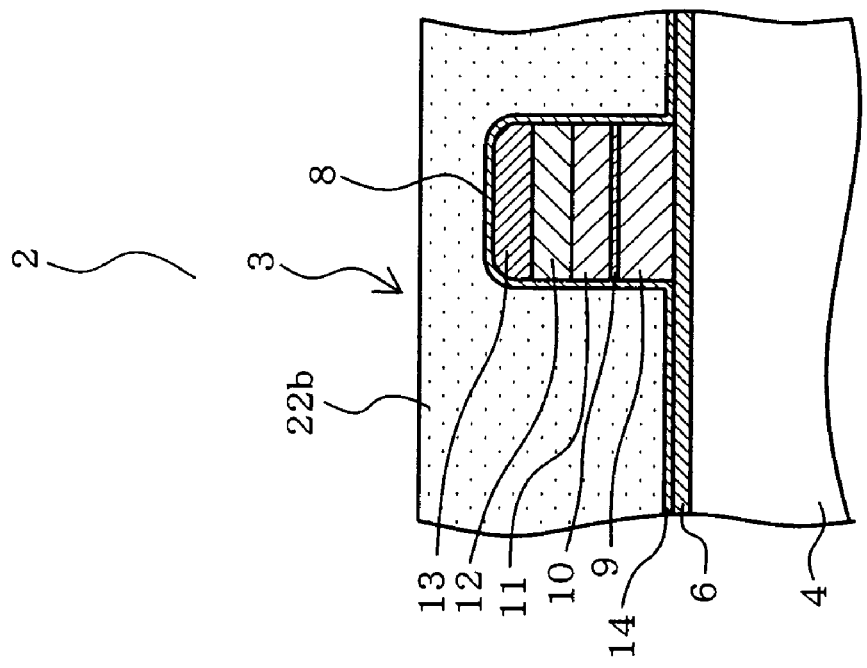

Subsequently, impurities are introduced through the opening 23 of the resist pattern 22a into lower areas of the select gates 7 by ion implantation so that the threshold is adjusted. In the ion implantation process, the substrate 4 is inclined so that ions are implanted obliquely in order that the impurities may be introduced into the lower portion of each gate electrode 7, as shown in FIGS. 5A and 5B. As a result, the ion implantation layer 4a as shown in FIG. 1B is formed, whereupon a stable threshold voltage differing from the threshold of the memory cell transistor is obtained. Furthermore, the silicon oxide film 14 exposed in the opening 23 is removed using the resist pattern 22a.

FIGS. 5A and 5B show the state where the silicon oxide film 14 has been removed. The silicon oxide film 14 is made by the CVD process and the gate oxide film 5 is formed by thermal oxidation. Accordingly, since an etching speed differs according to the difference in the film quality, the silicon oxide film 5 can be removed by the wet etching process so that the gate oxide film 5 remains.

Figure 7B:
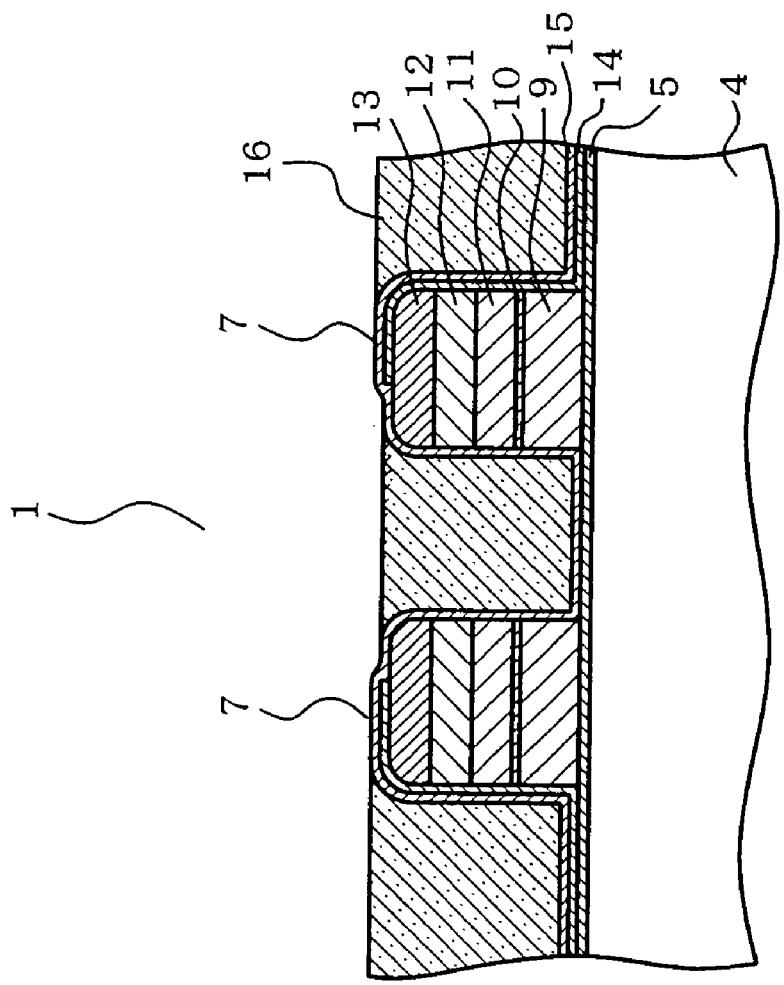
FIGS. 7A and 7B are similar to FIGS. 1A and 1B respectively, showing further another stage of the fabricating process.
Figure 7A:
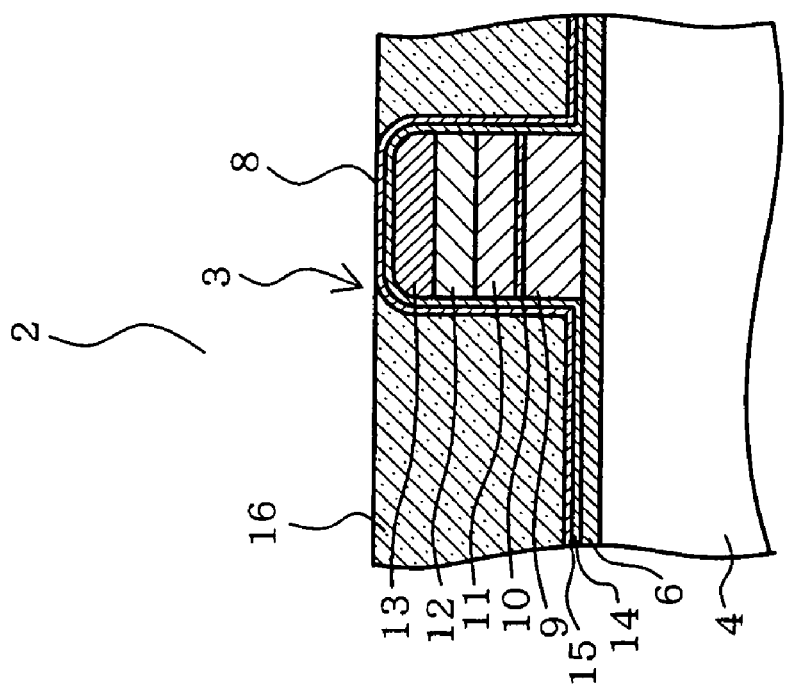

Subsequently, the resist patterns 22a and 22b are removed and the silicon nitride film 15 is formed on the entire surface as shown in FIGS. 6A and 6B. The BPSG film 16 serving as the interlayer insulation film is formed on the entire surface so as to fill the spaces between the gate electrodes 7 and 8. The chemical mechanical polishing (CMP) is carried out with the silicon nitride film 15 serving as a stopper so that the BPSG film 16 is flattened. As a result, the BPSG film 16 has a flat surface as shown in FIGS. 7A and 7B. A silicon oxide film 17 is further formed on the upper surface of the BPSG film 16 by plasma CVD (PCVD).

Figure 8B:
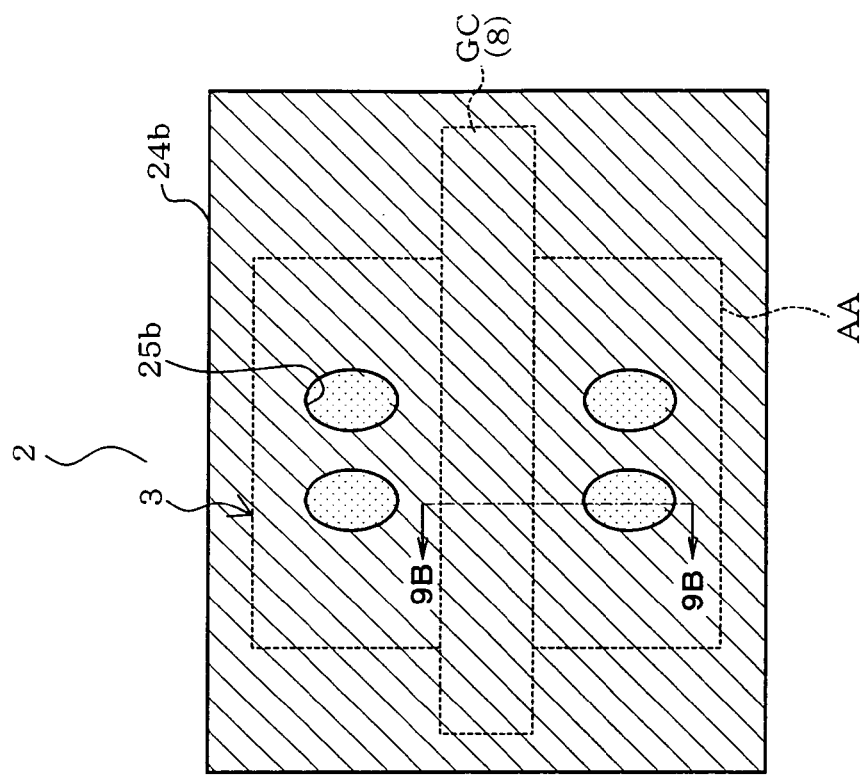
FIGS. 8A and 8B are similar to FIGS. 2A and 2B respectively, showing a resist pattern used to form a contact hole.
Figure 8A:
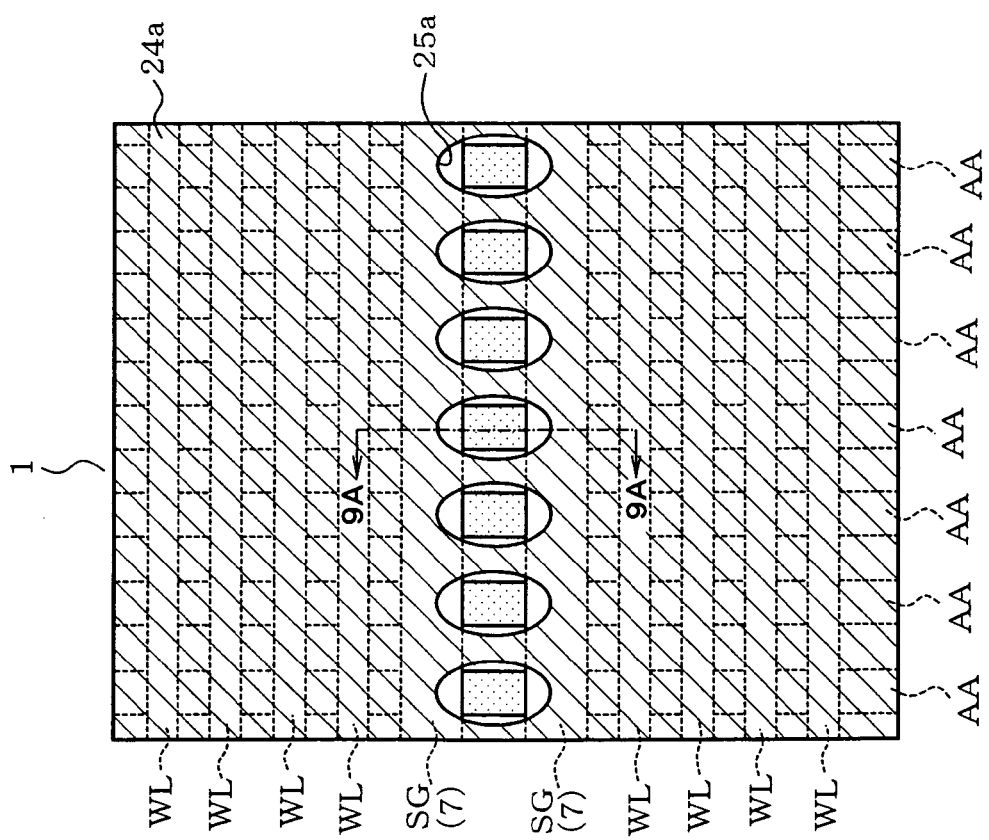

Subsequently, the photolithography process is carried out so that the contact holes 18 and 19 are formed in the silicon oxide film 17 and BPSG film 16. In this case, as shown in FIGS. 8A, 8B, 9A and 9B, the self-alignment contact holes 18 are formed between the select gates 7 in the memory cell region 1, whereas the contact holes 19 are formed on the transistor 3 by patterning. In this case, the resist pattern 24a of the memory cell region 1 has elliptic openings 25a each formed so that the entire active area AA between the select gates SG (7) is exposed therethrough as shown in FIG. 8A. Furthermore, the resist pattern 24b of the transistor 3 in the peripheral circuit region 2 has two elliptic openings 25b formed in the central portion of each of the active areas AA divided by the gate electrode GC (8).

Figure 10A:
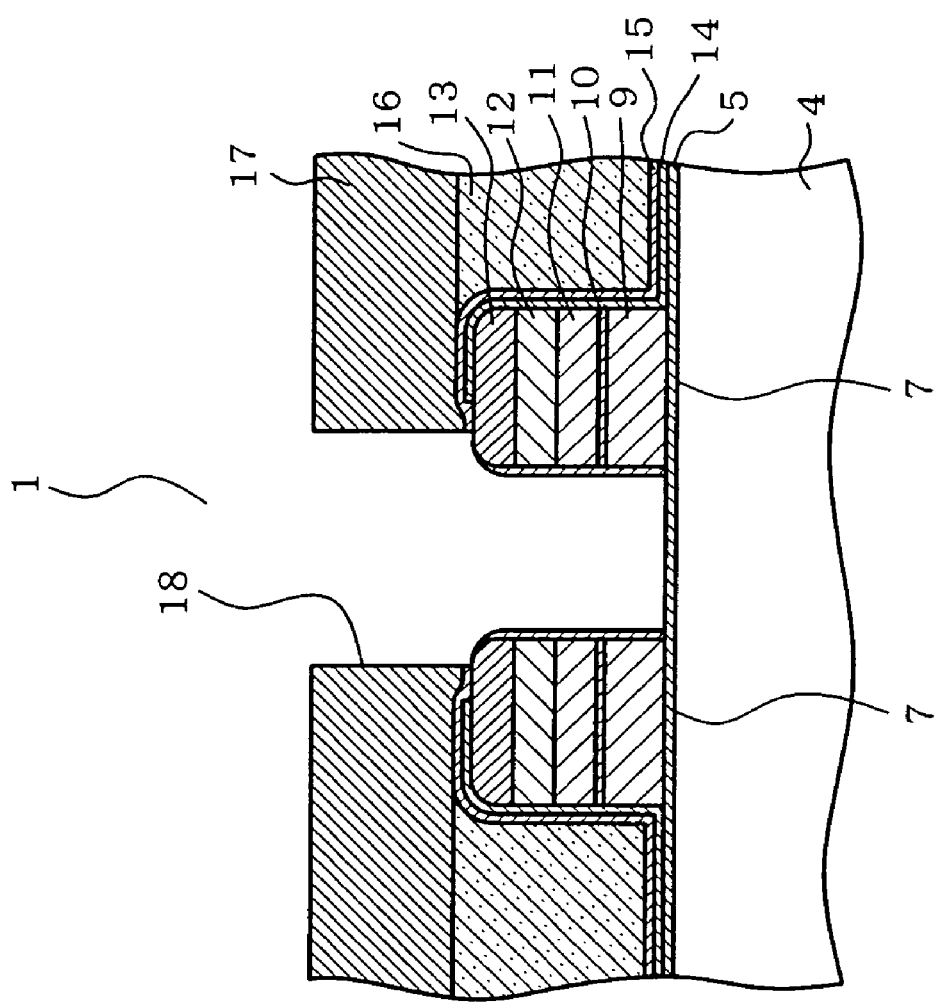
FIGS. 10A and 10B are similar to FIGS. 1A and 1B respectively, showing further another stage of the fabricating process.
Figure 10B:
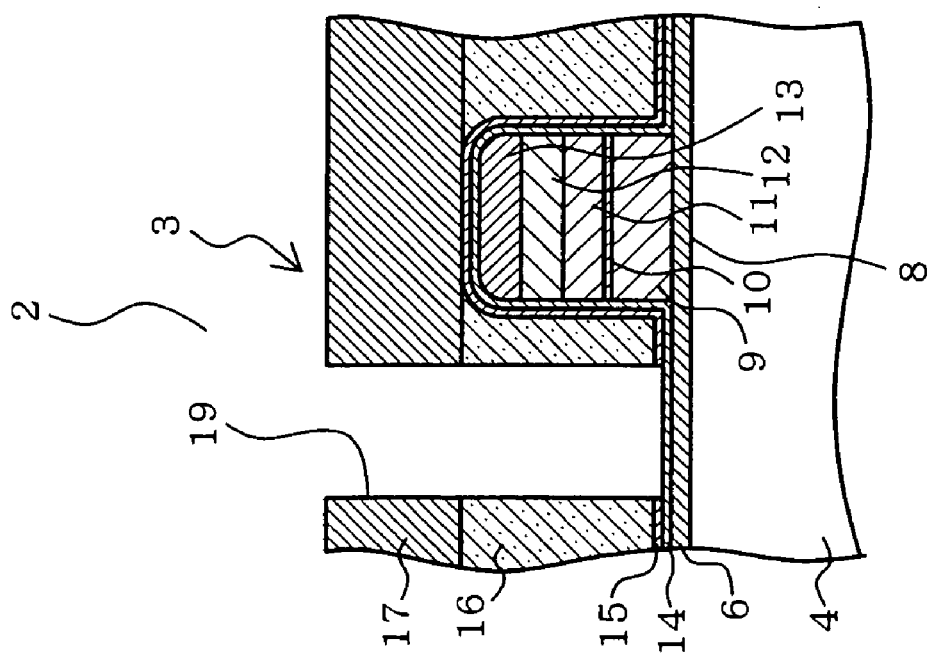

The contact holes 18 and 19 are formed using the resist patterns 24a and 24b. Firstly, the silicon oxide film 17 and BPSG film 16 are etched by the resist patterns 24a and 24b. In this case, an etching process is carried out under the condition of a higher selection ratio than the nitride film. The silicon nitride film 15 is used as an etching stopper, so that contact holes 19 and 18 are formed as shown in 9A and 9B. Each of the contact holes 18 and 19 has a bottom on which the silicon nitride film 15 remains. Subsequently, as shown in FIGS. 10A and 10B, the silicon nitride film 15 is etched under the condition of a higher section ratio than the oxide film, so that the gate oxide film 5 and silicon oxide film 14 remaining on the bottoms of the contact holes 18 and 19 are exposed. In this case, since the gate electrodes 7 of the memory cell region 1 are of the SAC type, side walls of the gate electrodes 7 are exposed. The silicon nitride films 15 formed on the side walls remains since the etching is anisotropic.

In the above-described state, a thin gate oxide film 5 remains on the bottom of each contact hole 18 in the memory cell region 1. A thin silicon oxide film 14 and a thick gate oxide film 6 remain on the bottom of each contact hole 19 in the transistor 3 in an overlapped state.

Subsequently, the silicon oxide film 14 and gate insulation films 5 and 6 are etched under a condition of higher selection ratio than the nitride film, whereupon the substrate 4 is exposed. The silicon nitride film 15 and nitride silicon film 13 do damage to the gate electrodes 7. In the aforesaid etching process, the damage to the films 15 and 13 is retrained. Accordingly, the contact holes 18 and 19 can reliably be formed. Thereafter, conductors serving as the contact plugs 20 are buried in the contact holes 18 and 19. Wiring conductors are patterned on the conductors, whereby the arrangement as shown in FIGS. 1A and 1B can be obtained.

The foregoing fabrication process has the following differences in comparison with the conventional fabrication process. In the conventional process, the ion implantation to the lower part of the select gate SG (7) for adjustment of the threshold is carried out in a step different from that in which the silicon oxide film 14 is removed. Consequently, the photolithography process can be reduced by once in the foregoing embodiment. In this case, in the process of removing the silicon oxide film 14, a rectangular pattern P as the resist pattern is provided which includes the region where the contact hole 19 is to be formed and which is open, as shown in FIG. 3B. The pattern P is used to avoid inconvenience resulting from the difference between oxide films in the process of forming the contact hole 19. Accordingly, when the resist pattern is used in the ion implantation, ions are inadvertently implanted to the high breakdown voltage transistor 3. This is undesirable from the point of the characteristic of necessitating high breakdown voltage.

Furthermore, when the silicon oxide film 14 is not removed in this step, a forming margin is reduced because of the difference between the silicon oxide film 14 and the thickness of an oxide film of the opening between the select gates 7 in the memory cell region 1 in the process of forming the contact hole 19, whereupon there is a possibility that the reliability in the fabrication may be reduced.

In the embodiment, however, ions are implanted only to the portions between the select gates 7 using the resist patterns 22a and 22b for the ion implantation process in the step of removing the oxide film, and the silicon oxide film 14 is removed. Regarding the silicon oxide film 14 remaining on the bottoms of the contact holes 18 and 19 and the difference in the film thickness between the gate oxide films 5 and 6, the etching condition for the silicon nitride film 15 is rendered different from the etching condition for the oxide films 14, 5 and 6. As a result, the selection ratio for the silicon oxide film is higher than that for the silicon nitride film in the process of etching the silicon oxide film 15, and the selection ratio for the silicon nitride film is higher than that for the silicon oxide film 14 in the process of etching the silicon oxide film 14. Consequently, the etching processes can reliably be carried out without doing damage to the silicon nitride and oxide films.

Consequently, when the fabrication process of the embodiment is applied to the semiconductor device, the number of times of photolithography process can be reduced as compared with the case where the conventional fabrication method is employed. As a result, costs can be reduced and the number of steps can be reduced.

The foregoing embodiment can be modified or expanded as follows. The ion implantation process for threshold adjustment may be interchanged by the process of removing the oxide film 14. Furthermore, although the wet etching is carried out in the process of removing the silicon oxide film 14, dry etching may be carried out, instead. The invention may be applied to other memory devices the photolithography process of the SAC type.

The foregoing description and drawings are merely illustrative of the principles of the present invention and are not to be construed in a limiting sense. Various changes and modifications will become apparent to those of ordinary skill in the art. All such changes and modifications are seen to fall within the scope of the appended claims.

What is claimed is:

1. A method of fabricating a semiconductor device, comprising:

forming gate insulation films in memory cell and peripheral circuit regions of a semiconductor substrate respectively, the gate insulation films having respective predetermined film thicknesses;

forming gate electrodes in the memory cell and peripheral circuit regions respectively;

forming an oxide film so that the gate electrodes are covered with the oxide film;

forming a resist pattern so that an opening between select gates of adjacent select gate transistors is formed in the memory cell region;

implanting threshold-adjusting ions under the select gate with the resist pattern serving as a mask and removing a portion of the oxide film;

forming a nitride film and an interlayer insulation film after the resist pattern has been removed;

forming a resist pattern used to form a contact hole between the select gates and a contact hole for a transistor to be provided in the peripheral circuit region, the transistor having a higher breakdown voltage than a memory cell transistor; and etching the interlayer insulation film, the nitride film and the gate insulation film individually with the resist pattern serving as a mask.

2. The method according to claim 1, wherein in the etching step, after the interlayer insulation film has been etched, the nitride film is etched with a higher selection ratio than the oxide film and the gate insulation film is etched with a higher selection ratio than the nitride film.

3. The method according to claim 1, wherein in the gate-insulation-film forming step, a thin gate insulation film is formed in the memory cell region and a thick gate insulation film is formed in the peripheral circuit region.

4. The method according to claim 1, wherein in the ion implanting and oxide-film removing step, the oxide film is removed under a condition where the gate oxide film remains.

* * * * *